US009495631B1

(12) United States Patent
Koepp et al.

(10) Patent No.: US 9,495,631 B1
(45) Date of Patent: Nov. 15, 2016

(54) RFID INTEGRATED CIRCUITS WITH CONTACT ISLANDS

(71) Applicant: Impinj, Inc., Seattle, WA (US)

(72) Inventors: Ronald L. Koepp, Seattle, WA (US); Harley K. Heinrich, Snohomish, WA (US); Christopher J. Diorio, Shoreline, WA (US); Tan Mau Wu, Seattle, WA (US)

(73) Assignee: IMPINJ INC., Seattle, WA (US)

( * ) Notice: Subject to any disclaimer, the term of this patent is extended or adjusted under 35 U.S.C. 154(b) by 0 days.

(21) Appl. No.: 13/945,490

(22) Filed: Jul. 18, 2013

Related U.S. Application Data

(63) Continuation-in-part of application No. 13/069,171, filed on Mar. 22, 2011, now Pat. No. 8,511,569.

(51) Int. Cl.
*G06K 19/06* (2006.01)
*G06K 19/077* (2006.01)

(52) U.S. Cl.
CPC ............... *G06K 19/07749* (2013.01)

(58) Field of Classification Search
CPC .......... H01L 2924/15165; H01L 2924/15153; H01L 2224/24227; H01L 2924/00; H01L 2924/14; H01L 2924/00014; H01L 2924/0002; H01L 2224/7665; H01L 2224/95085; H01L 21/67144; H01L 21/563; H01L 21/673; H01L 21/44; H01L 2224/48091; H01L 2224/73265; H01L 2224/16225; H01L 2224/48227; H01L 2224/48247; H01L 2224/131; H01L 2224/16227; G06K 19/07749; G06K 19/0723; G06K 19/07722
See application file for complete search history.

(56) References Cited

U.S. PATENT DOCUMENTS

| 7,551,141 | B1 * | 6/2009 | Hadley et al. ......... 343/700 MS |
| 2004/0183182 | A1 * | 9/2004 | Swindlehurst et al. ...... 257/686 |
| 2006/0057763 | A1 * | 3/2006 | Teo .................. H01L 24/83 438/64 |
| 2009/0294542 | A1 | 12/2009 | Rogy et al. | |

OTHER PUBLICATIONS

Office Action received for U.S. Appl. No. 14/132,959, mailed Mar. 3, 2015 and filed on Dec. 18, 2013.
Office Action received for U.S. Appl. No. 14/956,412, mailed Apr. 22, 2016 and filed on Dec. 2, 2015.

* cited by examiner

*Primary Examiner* — Thien T Mai
(74) *Attorney, Agent, or Firm* — Turk IP Law, LLC

(57) ABSTRACT

A Radio Frequency Identification (RFID) IC may have raised contact islands that include conductive contact pads covering a repassivation layer. The raised contact islands are formed by removing part or all of the repassivation material surrounding the raised contact islands. The repassivation material that is not covered and protected by the contact pads may be removed by a strip process that also removes a masking layer used for IC etching. Singulated RFID ICs may be assembled into an RFID tag using a B-stage adhesive that is applied to the ICs and then partially cured. The ICs are deposited onto preheated inlays. The preheated inlays cause the B-stage adhesive on the ICs to bind to the inlays.

17 Claims, 13 Drawing Sheets

SIGNAL PATH DURING R→T

SIGNAL PATH DURING T→R

RFID INTEGRATED CIRCUITS WITH CONTACT ISLANDS

CROSS REFERENCE TO RELATED APPLICATIONS

This application is a continuation-in-part of U.S. patent application Ser. No. 13/069,171 filed on Mar. 22, 2011. The disclosures of the foregoing patent application are hereby incorporated by reference for all purposes.

BACKGROUND

Radio-Frequency Identification (RFID) systems typically include RFID readers, also known as RFID reader/writers or RFID interrogators, and RFID tags. RFID systems can be used in many ways for locating and identifying objects to which the tags are attached. RFID systems are useful in product-related and service-related industries for tracking objects being processed, inventoried, or handled. In such cases, an RFID tag is usually attached to an individual item, or to its package.

In principle, RFID techniques entail using an RFID reader to interrogate one or more RFID tags. The reader transmitting a Radio Frequency (RF) wave performs the interrogation. The RF wave is typically electromagnetic, at least in the far field. The RF wave can also be predominantly electric or magnetic in the near field. The RF wave may encode one or more commands that instruct the tags to perform one or more actions.

A tag that senses the interrogating RF wave may respond by transmitting back another RF wave. The tag either generates the transmitted back RF wave originally, or by reflecting back a portion of the interrogating RF wave in a process known as backscatter. Backscatter may take place in a number of ways.

The reflected-back RF wave may encode data stored in the tag, such as a number. The response is demodulated and decoded by the reader, which thereby identifies, counts, or otherwise interacts with the associated item. The decoded data can denote a serial number, a price, a date, a destination, other attribute(s), any combination of attributes, and so on. Accordingly, when a reader receives tag data it can learn about the item that hosts the tag and/or about the tag itself.

An RFID tag typically includes an antenna section, a radio section, a power-management section, and frequently a logical section, a memory, or both. In some RFID tags the power-management section included an energy storage device such as a battery. RFID tags with an energy storage device are known as battery-assisted, semi-active, or active tags. Other RFID tags can be powered solely by the RF signal they receive. Such RFID tags do not include an energy storage device and are called passive tags. Of course, even passive tags typically include temporary energy- and data/flag-storage elements such as capacitors or inductors.

BRIEF SUMMARY

This summary is provided to introduce a selection of concepts in a simplified form that are further described below in the Detailed Description. This summary is not intended to identify key features or essential features of the claimed subject matter, nor is it intended as an aid in determining the scope of the claimed subject matter.

Embodiments are directed to an RFID tag integrated circuit (IC) having raised contact islands. The raised contact islands include conductive contact pads covering a repassivation layer. The raised contact islands are formed by removing, partially or completely, regions of the repassivation layer that are not covered by the contact pads. The removing may be accomplished by a strip process that also removes an IC etch or implant mask layer, and may be a by-product of that strip process.

Embodiments are also directed to assembling an RFID tag using B-stage adhesives. A B-stage adhesive is applied to ICs and partially cured. The ICs are then deposited onto preheated inlays. The preheated inlays cause the B-stage adhesive on the ICs to bind to the inlays. In some embodiments the B-stage adhesive is applied to the raised contact islands.

These and other features and advantages will be apparent from a reading of the following detailed description and a review of the associated drawings. It is to be understood that both the foregoing general description and the following detailed description are explanatory only and are not restrictive of aspects as claimed.

BRIEF DESCRIPTION OF THE DRAWINGS

The following Detailed Description proceeds with reference to the accompanying drawings, in which.

DETAILED DESCRIPTION

In the following detailed description, references are made to the accompanying drawings that form a part hereof, and in which are shown by way of illustration specific embodiments or examples. These embodiments or examples may be combined, other aspects may be utilized, and structural changes may be made without departing from the spirit or scope of the present disclosure. The following detailed description is therefore not to be taken in a limiting sense, and the scope of the present invention is defined by the appended claims and their equivalents.

As used herein, "memory" is one of ROM, RAM, SRAM, DRAM, NVM, EEPROM, FLASH, Fuse, MRAM, FRAM, and other similar information-storage technologies as will be known to those skilled in the art. Some portions of memory may be writeable and some not. "Command" refers to a reader request for one or more tags to perform one or more actions. "Protocol" refers to an industry standard for communications between a reader and a tag (and vice versa), such as the Class-1 Generation-2 UHF RFID Protocol for Communications at 860 MHz-960 MHz by EPCglobal, Inc. ("Gen2 Specification"), version 1.2.0 of which is hereby incorporated by reference.

Figure 1:
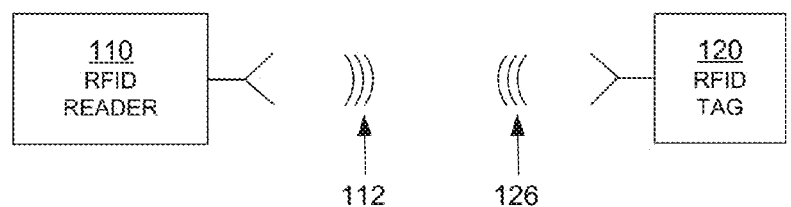
FIG. 1 is a block diagram of components of an RFID system.

FIG. 1 is a diagram of the components of a typical RFID system 100, incorporating embodiments. An RFID reader 110 transmits an interrogating RF signal 112. RFID tag 120 in the vicinity of RFID reader 110 senses interrogating RF signal 112 and generate signal 126 in response. RFID reader 110 senses and interprets signal 126. The signals 112 and 126 may include RF waves and/or non-propagating RF signals (e.g., reactive near-field signals)

Reader 110 and tag 120 communicate via signals 112 and 126. When communicating, each encodes, modulates, and transmits data to the other, and each receives, demodulates, and decodes data from the other. The data can be modulated onto, and demodulated from, RF waveforms. The RF waveforms are typically in a suitable range of frequencies, such as those near 900 MHz, 13.56 MHz, and so on.

The communication between reader and tag uses symbols, also called RFID symbols. A symbol can be a delimiter, a calibration value, and so on. Symbols can be implemented for exchanging binary data, such as "0" and "1", if that is desired. When symbols are processed by reader 110 and tag 120 they can be treated as values, numbers, and so on.

Tag 120 can be a passive tag, or an active or battery-assisted tag (i.e., a tag having its own power source). When tag 120 is a passive tag, it is powered from signal 112.

Figure 2:
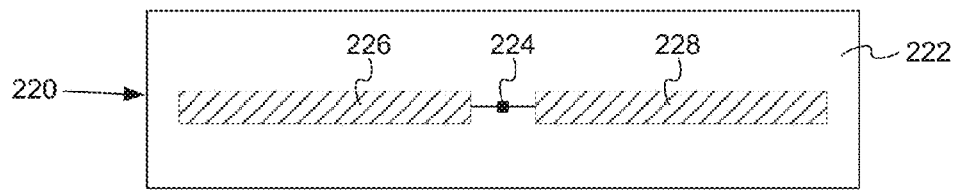
FIG. 2 is a diagram showing components of passive RFID tags formed by a variety of methods; each can be used in the system of FIG. 1.
Figure 2:
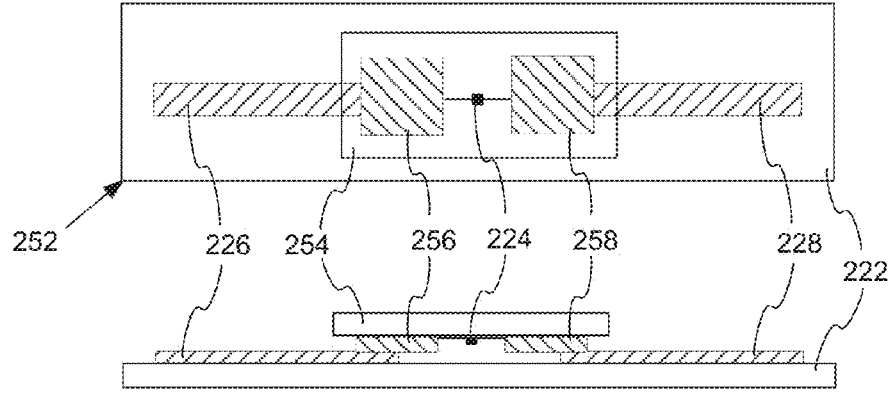
Figure 2:
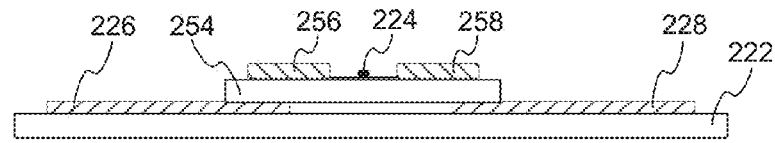

FIG. 2 is a diagram of an RFID tag 220, which may function as tag 120 of FIG. 1. Tag 220 is drawn as a passive tag, meaning it does not have its own power source. Much of what is described in this document, however, applies also to active and battery-assisted tags.

Tag 220 is typically (although not necessarily) formed on a substantially planar inlay 222, which can be made in many ways known in the art. Tag 220 includes a circuit which may be implemented as an IC 224. In some embodiments IC 224 is implemented in complementary metal-oxide semiconductor (CMOS) technology. In other embodiments IC 224 may be implemented in other technologies such as bipolar junction transistor (BJT) technology, metal-semiconductor field-effect transistor (MESFET) technology, and others as will be well known to those skilled in the art. IC 224 is arranged on inlay 222.

Tag 220 also includes an antenna for exchanging wireless signals with its environment. The antenna is often flat and attached to inlay 222. IC 224 is electrically coupled to the antenna via suitable antenna contacts (not shown in FIG. 2). The term "electrically coupled" as used herein may mean a direct electrical connection, or it may mean a connection that includes one or more intervening circuit blocks, elements, or devices. The "electrical" part of the term "electrically coupled" as used in this document shall mean a coupling that is one or more of ohmic/galvanic, capacitive, and/or inductive.

IC 224 is shown with a single antenna port, comprising two antenna contacts electrically coupled to two antenna segments 226 and 228 which are shown here forming a dipole. Many other embodiments are possible using any number of ports, contacts, antennas, and/or antenna segments.

Diagram 250 depicts top and side views of tag 252, formed using a strap. Tag 252 differs from tag 220 in that it includes a substantially planar strap substrate 254 having strap contacts 256 and 258. IC 224 is mounted on strap substrate 254 such that the antenna contacts on IC 224 electrically couple to strap contacts 256 and 258 via suitable connections (not shown). Strap substrate 254 is then placed on inlay 222 such that strap contacts 256 and 258 electrically couple to antenna segments 226 and 228. Strap substrate 254 may be affixed to inlay 222 via pressing, an interface layer, one or more adhesives, or any other suitable means.

Diagram 260 depicts a side view of an alternative way to place strap substrate 254 onto inlay 222. Instead of strap substrate 254's surface, including strap contacts 256/258, facing the surface of inlay 222, strap substrate 254 is placed with its strap contacts 256/258 facing away from the surface of inlay 222. Strap contacts 256/258 can then be either capacitively coupled to antenna segments 226/228 through strap substrate 254, or conductively coupled using a through-via which may be formed by crimping strap contacts 256/258 to antenna segments 226/228. In some embodiments the positions of strap substrate 254 and inlay 222 may be reversed, with strap substrate 254 mounted beneath strap substrate 222 and strap contacts 256/258 electrically coupled to antenna segments 226/228 through inlay 222. Of course, in yet other embodiments strap contacts 256/258 may electrically couple to antenna segments 226/228 through both inlay 222 and strap substrate 254.

In operation, the antenna receives a signal and communicates it to IC 224, which both harvests power and responds if appropriate, based on the incoming signal and the IC's internal state. If IC 224 uses backscatter modulation then it responds by modulating the antenna's reflectance, which generates response signal 126 from signal 112 transmitted by the reader. Electrically coupling and uncoupling the antenna contacts of IC 224 can modulate the antenna's reflectance, as can varying the admittance of a shunt-connected circuit element which is coupled to the antenna contacts. Varying the impedance of a series-connected circuit element is another means of modulating the antenna's reflectance.

In the embodiments of FIG. 2, antenna segments 226 and 228 are separate from IC 224. In other embodiments the antenna segments may alternatively be formed on IC 224. Tag antennas according to embodiments may be designed in any form and are not limited to dipoles. For example, the tag antenna may be a patch, a slot, a loop, a coil, a horn, a spiral, a monopole, microstrip, stripline, or any other suitable antenna.

The components of the RFID system of FIG. 1 may communicate with each other in any number of modes. One such mode is called full duplex. Another such mode is called half-duplex, and is described below.

Figure 3:
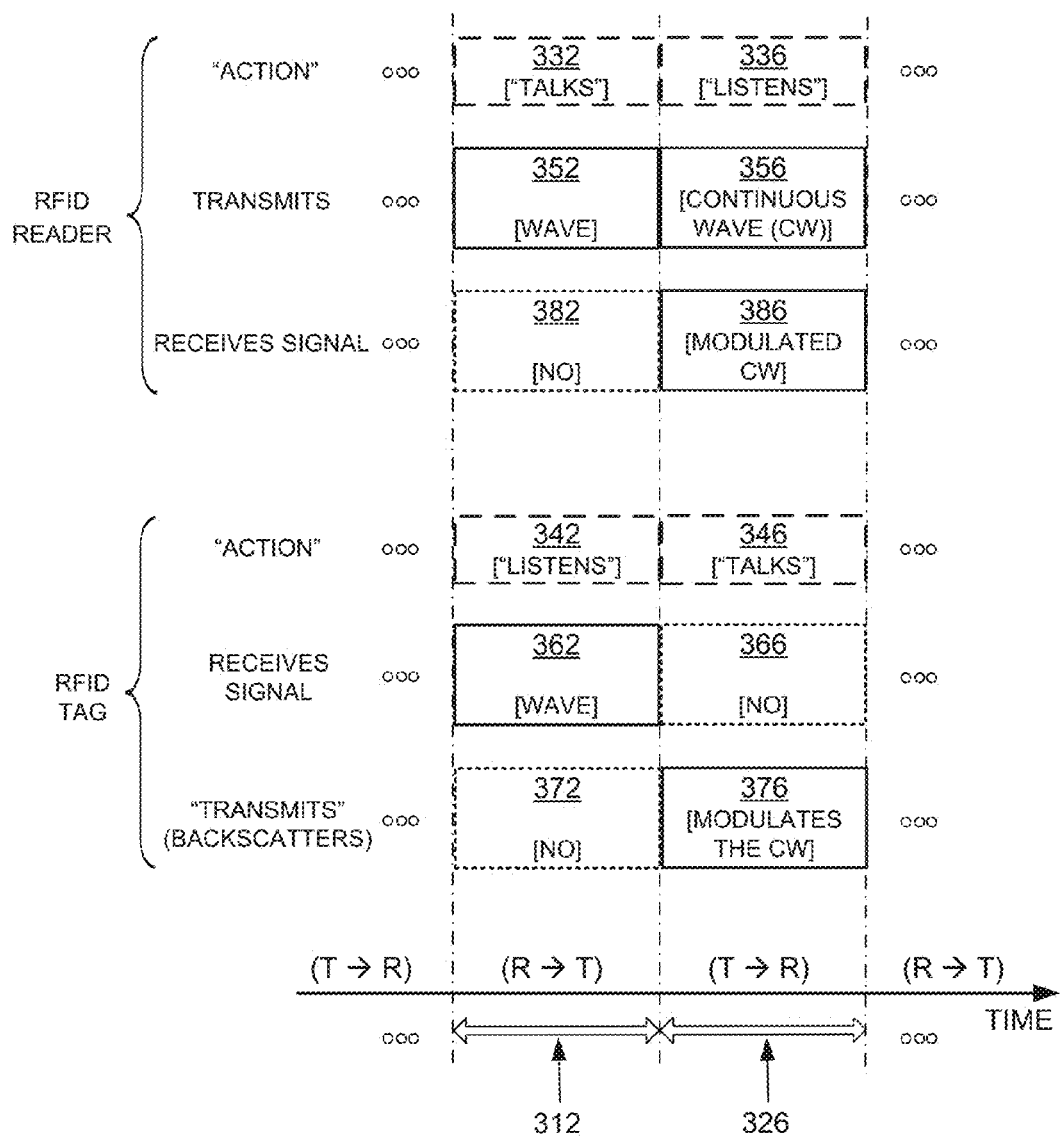
FIG. 3 is a conceptual diagram for explaining a half-duplex mode of communication between the components of the RFID system of FIG. 1.

FIG. 3 is a conceptual diagram 300 for explaining half-duplex communications between the components of the RFID system of FIG. 1, in this case with tag 120 implemented as passive tag 220 of FIG. 2. The explanation is made with reference to a TIME axis, and also to a human metaphor of "talking" and "listening". The actual technical implementations for "talking" and "listening" are now described.

RFID reader 110 and RFID tag 120 talk and listen to each other by taking turns. As seen on axis TIME, when reader 110 talks to tag 120 the communication session is designated as "R→T", and when tag 120 talks to reader 110 the communication session is designated as "T→R". Along the TIME axis, a sample R→T communication session occurs during a time interval 312, and a following sample T→R communication session occurs during a time interval 326. Of course interval 312 is typically of a different duration than interval 326—here the durations are shown approximately equal only for purposes of illustration.

According to blocks 332 and 336, RFID reader 110 talks during interval 312, and listens during interval 326. According to blocks 342 and 346, RFID tag 120 listens while reader 110 talks (during interval 312), and talks while reader 110 listens (during interval 326).

In terms of actual behavior, during interval 312 reader 110 talks to tag 120 as follows. According to block 352, reader 110 transmits signal 112, which was first described in FIG. 1. At the same time, according to block 362, tag 120 receives signal 112 and processes it to extract data and so on. Meanwhile, according to block 372, tag 120 does not backscatter with its antenna, and according to block 382, reader 110 has no signal to receive from tag 120.

During interval 326, tag 120 talks to reader 110 as follows. According to block 356, reader 110 transmits a Continuous Wave (CW) signal, which can be thought of as a carrier that typically encodes no information. This CW signal serves both to transfer energy to tag 120 for its own internal power needs, and also as a carrier that tag 120 can modulate with its backscatter. Indeed, during interval 326, according to block 366, tag 120 does not receive a signal for processing. Instead, according to block 376, tag 120 modulates the CW emitted according to block 356 so as to generate backscatter signal 126. Concurrently, according to block 386, reader 110 receives backscatter signal 126 and processes it.

Figure 4:
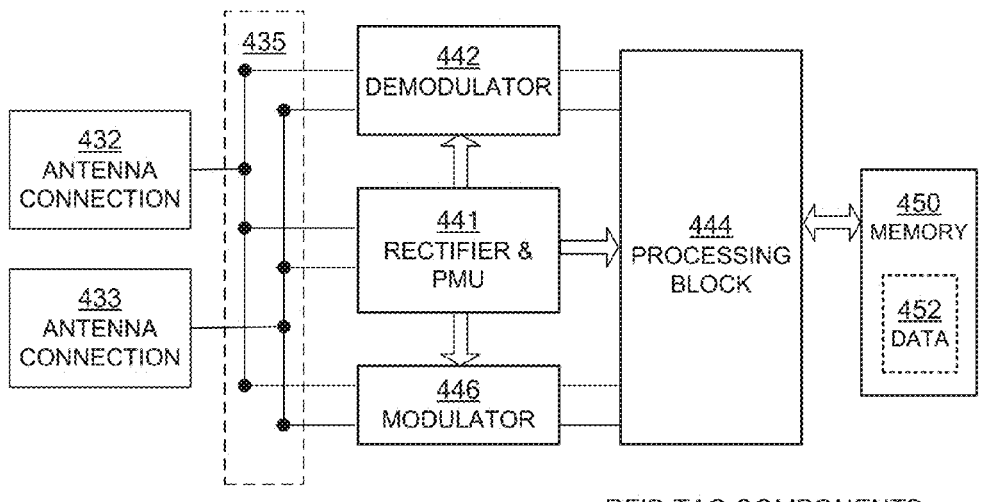
FIG. 4 is a block diagram showing a detail of an RFID integrated circuit (IC) for an RFID tag, such as the ICs and tags shown in FIG. 2.

FIG. 4 is a block diagram showing a detail of an RFID IC, such as IC 224 in FIG. 2. Electrical circuit 424 in FIG. 4 may be formed in an IC of an RFID tag, such as tag 220 of FIG. 2. Circuit 424 has a number of main components that are described in this document. Circuit 424 may have a number of additional components from what is shown and described, or different components, depending on the exact implementation.

Circuit 424 shows two antenna contacts 432, 433, suitable for coupling to antenna segments such as segments 226 and 228 of RFID tag 220 of FIG. 2. When two antenna contacts form the signal input from, and signal return to, an antenna they are often referred-to as an antenna port. Antenna contacts 432, 433 may be made in any suitable way, such as from metallic pads and so on. In some embodiments circuit 424 uses more than two antenna contacts, especially when tag 220 has more than one antenna port and/or more than one antenna.

Circuit 424 also includes signal-routing section 435 which may include signal wiring, a receive/transmit switch that can selectively route a signal, and so on.

Circuit 424 also includes a rectifier and PMU (Power Management Unit) 441 that harvests energy from the RF signal received by antenna segments 226 and 228 to power the circuits of IC 424 during either or both reader-to-tag (R→T) and tag-to-reader (T→R) sessions. Rectifier and PMU 441 may be implemented in any way known in the art.

Circuit 424 additionally includes a demodulator 442 that demodulates the RF signal received via antenna contacts 432, 433. Demodulator 442 may be implemented in any way known in the art, for example including a slicer, an amplifier, and so on.

Circuit 424 further includes a processing block 444 that receives the output from demodulator 442 and performs operations such as command decoding, memory interfacing, and so on. In addition, processing block 444 may generate an output signal for transmission. Processing block 444 may be implemented in any way known in the art, for example by combinations of one or more of a processor, memory, decoder, encoder, and so on.

Circuit 424 additionally includes a modulator 446 that modulates an output signal generated by processing block 444. The modulated signal is transmitted by driving antenna contacts 432, 433, and therefore driving the load presented by the coupled antenna segment or segments. Modulator 446 may be implemented in any way known in the art, for example including a switch, driver, amplifier, and so on.

In one embodiment, demodulator 442 and modulator 446 may be combined in a single transceiver circuit. In another embodiment modulator 446 may modulate a signal using backscatter. In another embodiment modulator 446 may include an active transmitter. In yet other embodiments demodulator 442 and modulator 446 may be part of processing block 444.

Circuit 424 additionally includes a memory 450 to store data 452. At least a portion of memory 450 is preferably implemented as a Nonvolatile Memory (NVM), which means that data 452 is retained even when circuit 424 does not have power, as is frequently the case for a passive RFID tag.

In some embodiments, particularly in those with more than one antenna port, circuit 424 may contain multiple demodulators, rectifiers, PMUs, modulators, processing blocks, and/or memories.

In terms of processing a signal, circuit 424 operates differently during a R→T session and a T→R session. The different operations are described below, in this case with circuit 424 representing an IC of an RFID tag.

Figure 5A:
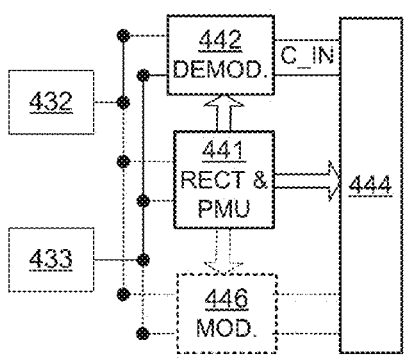
FIGS. 5A and 5B illustrate signal paths during tag-to-reader and reader-to-tag communications in the block diagram of FIG. 4.

FIG. 5A shows version 524-A of components of circuit 424 of FIG. 4, further modified to emphasize a signal operation during a R→T session during time interval 312 of FIG. 3. Demodulator 442 demodulates an RF signal received from antenna contacts 432, 433. The demodulated signal is provided to processing block 444 as C_IN. In one embodiment, C_IN may include a received stream of symbols.

Version 524-A shows as relatively obscured those components that do not play a part in processing a signal during a R→T session. Rectifier and PMU 441 may be active, such as for converting RF power. Modulator 446 generally does not transmit during a R→T session, and typically does not interact with the received RF signal significantly, either because switching action in section 435 of FIG. 4 decouples modulator 446 from the RF signal, or by designing modulator 446 to have a suitable impedance, and so on.

Although modulator 446 is typically inactive during a R→T session, it need not be so. For example, during a R→T session modulator 446 could be adjusting its own parameters for operation in a future session, and so on.

Figure 5B:
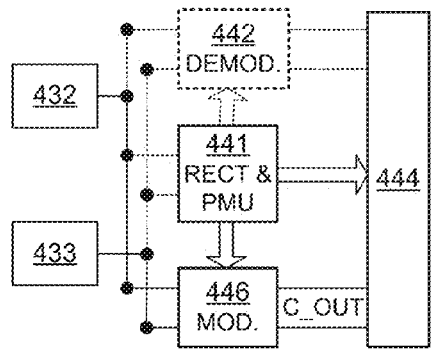

FIG. 5B shows version 524-B of components of circuit 424 of FIG. 4, further modified to emphasize a signal operation during a T→R session during time interval 326 of FIG. 3. Processing block 444 outputs a signal C_OUT. In one embodiment, C_OUT may include a stream of symbols for transmission. Modulator 446 then modulates C_OUT and provides it to antenna segments such as segments 226/228 of RFID tag 220 via antenna contacts 432, 433.

Version 524-B shows as relatively obscured those components that do not play a part in processing a signal during a T→R session. Rectifier and PMU 441 may be active, such as for converting RF power. Demodulator 442 generally does not receive during a T→R session, and typically does not interact with the transmitted RF signal significantly, either because switching action in section 435 of FIG. 4 decouples demodulator 442 from the RF signal, or by designing demodulator 442 to have a suitable impedance, and so on.

Although demodulator 442 is typically inactive during a T→R session, it need not be so. For example, during a T→R session demodulator 442 could be adjusting its own parameters for operation in a future session, and so on.

In typical embodiments, demodulator 442 and modulator 446 are operable to demodulate and modulate signals according to a protocol, such as the Gen2 Specification referenced above. In embodiments where circuit 424 includes multiple demodulators and/or modulators, each may be configured to support different protocols or different sets of protocols. A protocol specifies, in part, symbol encodings, and may include a set of modulations, rates, timings, or any other parameter associated with data communications.

In the above, an RFID reader/interrogator may communicate with one or more RFID tags in any number of ways. Some such ways are described in protocols. A protocol is a specification or industry standard that calls for specific manners of signaling between the reader and the tags. For example, the Gen2 Specification referenced above is one such protocol. In addition, a protocol can be a variant of a stated specification such as the Gen2 Specification, for example including fewer or additional commands than the stated specification calls for, and so on. In such instances, additional commands are sometimes called custom commands.

An RFID tag may be manufactured by physically attaching an RFID IC to a tag inlay having a substrate and an antenna, and electrically coupling the RFID IC to the antenna. For example, the RFID IC may be pressed onto the tag inlay and then electrically coupled to the antenna via one or more contact bumps on the IC and/or on the antenna. However, one challenge with this manufacturing method is that the mounting force for pressing the IC and the tag inlay together may vary from tag to tag, in turn affecting the electrical properties and performance of the completed tag. An RFID IC and its coupled antenna form a tuned circuit whose tuning varies, in part, with the amount of unwanted parasitic capacitive coupling between circuits in the IC and the antenna. This parasitic mounting capacitance can be quantified as:

$$C = \varepsilon_0 \varepsilon_r \frac{A}{d} \quad [1]$$

where $\varepsilon_0$ is the free-space permittivity, $\varepsilon_r$ is the relative permittivity, A is the area of the overlap between the antenna and the circuits, and d is the distance between the antenna and the circuits. Ideally, the area A varies by only a small amount, both because an RFID IC can typically be placed onto the inlay with good placement accuracy, and because the overlap is approximately constant even if the IC is not placed accurately because this capacitance is distributed over the entire area of the IC-to-antenna overlap. The distance d, however can change significantly with the mounting force applied during the mounting process, causing correspondingly significant changes in capacitance C. Hence, variations in mounting force result in tags with varying mounting capacitances and therefore varying tuning.

Figure 6:
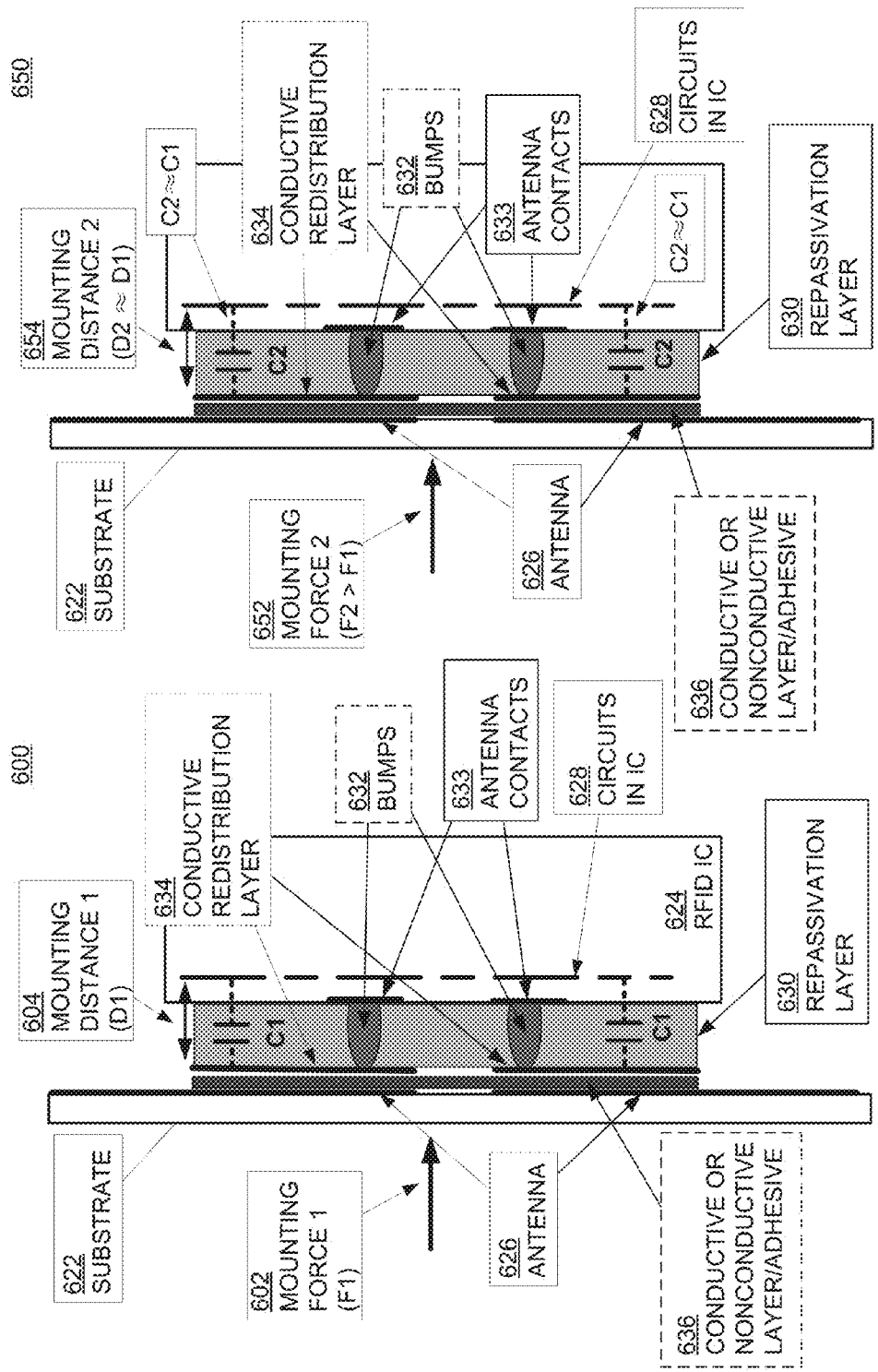
FIG. 6 illustrates tag antenna mounting with a repassivation layer to reduce variations in mounting capacitance between an IC and a tag antenna layer according to embodiments.

In embodiments, a nonconductive repassivation layer may be used to reduce variations in mounting capacitance. The repassivation layer may cover a surface of the IC, be disposed between the IC and a substrate, or be disposed between antenna contact pads and the rest of the IC, as depicted in FIG. 6. In some embodiments the repassivation layer mitigates mounting-capacitance variations by ensuring a fixed distance between the circuits of the IC and the antenna layer. In other embodiments the repassivation layer mitigates parasitic capacitance variations between circuits of the IC and large antenna contact pads, again by ensuring a fixed distance between these circuits and the contact pads.

In some embodiments, the repassivation layer is confined within a perimeter of the IC surface on which it is disposed. In other embodiments the repassivation layer may extend beyond the perimeter of the IC and may be subsequently removed by stripping, etching, or as a by-product of singulating the ICs.

FIG. 6 illustrates IC-to-tag antenna mounting with a repassivation layer to reduce mounting-capacitance variations.

FIG. 6 shows a diagram 600 in which an RFID strap or inlay comprising substrate 622 and antenna terminals 626 is pressed against RFID IC 624 with a mounting force F1 (602), where antenna terminals 626 are separated from IC 624 by at least repassivation layer 630. Mounting distance D1 (604) is fixed by repassivation layer 630, producing a similarly fixed mounting capacitance C1.

Diagram 650 shows the RFID strap or inlay being pressed against the RFID IC with a mounting force F2 (652) which is larger than mounting force F1 (602). The repassivation layer 630 ensures that mounting distance D2 (654) is substantially the same as mounting distance D1 (604) despite the larger mounting force F2. As a result, mounting capacitance C2 is substantially similar to mounting capacitance C1, helping ensure that the tags have similar tuning and consequent similar performance.

In some embodiments a conductive redistribution layer 634 covers a large portion of the surface of RFID IC 624. Conductive redistribution layer 634 may be metal, doped silicon, graphene, or another material that is electrically conductive or possesses metallic properties. Conductive redistribution layer 634 may be applied or deposited on repassivation layer 630, for example by evaporation, sputtering, or direct transfer. In some embodiments, conductive redistribution layer 634 may be patterned to form contact pads, strips, or have any desired shape. This patterning may employ a masking step to define the contact pattern (e.g., with photoresist) and an etching step (if masking occurs after layer deposition) or a liftoff/removal step (if masking occurs before layer deposition). In some embodiments conductive redistribution layer 634 may be applied to another substrate, patterned, and then transferred to the IC. Although only one conductive redistribution layer is depicted in FIG. 6, in some embodiments multiple conductive redistribution layers may be present. Similarly, conductive redistribution layer 634 may comprise a single or multiple portions. For example, conductive redistribution layer 634 on repassivation layer 630 may be patterned to provide multiple contact areas electrically decoupled from each other.

In some embodiments, conductive redistribution layer 634 is confined within the perimeter of repassivation layer 630 and/or the IC surface. In other embodiments, conductive redistribution layer 634 may extend beyond the perimeter of repassivation layer 630 and/or the IC surface and may be subsequently removed by stripping, etching, or as a by-product of singulating the ICs.

In some embodiments, bumps 632 formed in openings in repassivation layer 630 galvanically couple antenna contacts 633 (similar to antenna contacts 432/433) to conductive redistribution layer 634. In other embodiments, antenna contacts 633 capacitively couple to conductive redistribution layer 634 through repassivation layer 630. In some embodiments, conductive redistribution layer 634 may be deposited in or over openings in repassivation layer 630, thereby directly coupling antenna contacts 633 to conductive redistribution layer 634. In other embodiments, portions of repassivation layer 630 may be made conductive, allowing galvanic coupling between antenna contacts 633 and conductive redistribution layer 634 through these conductive portions. In yet other embodiments, conductive redistribution layer 634 may extend beyond the periphery of repassivation layer 630 to galvanically couple around it and to antenna contacts 633.

Repassivation layer 630 may be an organic or inorganic material, typically (although not necessarily) with a relatively low dielectric constant and a reasonable thickness to minimize parasitic coupling capacitance as described above. Examples of organic materials include but are not limited to polyimide-based materials, Spheron™ WLP manufactured by RoseStreet Labs based in Phoenix, Ariz., or benzocyclobutene-based materials (e.g., bisbenzocyclobutene, BCB). An additional layer 636 may be applied between the IC and the strap/inlay to attach the IC to the strap/inlay, physically and/or electrically. Layer 636 may include an anisotropic conductive adhesive or layer, a patterned conductive adhesive or layer, and/or a nonconductive adhesive or layer. If layer 636 is nonconductive then it is typically sufficiently thin as to provide low-impedance capacitive coupling between antenna terminals 626 and conductive redistribution layer 634 at the frequencies of RFID communications. Whereas FIG. 6 shows layer 636 contacting both of the antenna terminals 626 and both portions of conductive redistribution layer 634, in some embodiments layer 636 may be patterned to prevent antenna terminals 626 from coupling with each other, or to prevent portions of conductive redistribution layer 634 from coupling with each other. For example, layer 636 may be patterned such that a particular portion of conductive redistribution layer 634 only galvanically couples with one of the antenna terminals 626, and does not galvanically couple with the other antenna terminal or with other portions of conductive redistribution layer 634. Of course, in some embodiments layer 636 may not be present at all.

In some embodiments, repassivation layer 630 may include an air gap that separates conductive redistribution layer 634 from IC 624 to further decouple the two capacitively. The air gap may be bridged by support pillar(s) between conductive redistribution layer 634 and IC 624 (including contacts that electrically couple the two). In some embodiments, conductive redistribution layer 634 may employ a mesh structure to further reduce the capacitive coupling.

A conductive redistribution layer 634 that includes relatively large pads may also help to protect underlying repassivation layer 630 during IC fabrication. For example, conductive redistribution layer 634 may serve as an etch mask that covers and prevents etching or damage to underlying portions of repassivation layer 630 during processing like that described below in FIGS. 13 and 14 and in U.S. Pat. No. 7,482,251 issued on Jan. 27, 2009, the entirety of which is hereby incorporated by reference.

As described above, in many cases RFID ICs can be placed onto an inlay with relatively good placement accuracy. Accurate alignment of an IC to an inlay antenna allows proper coupling between the IC contacts and the antenna terminals. One way to couple the IC to the antenna terminals involves using metallic posts, also known as bumps. However, in some situations using bumps for coupling may be undesirable. Bumps form a stress point on the IC, reducing its strength and potentially resulting in IC breakage during further processing.

Figure 7:
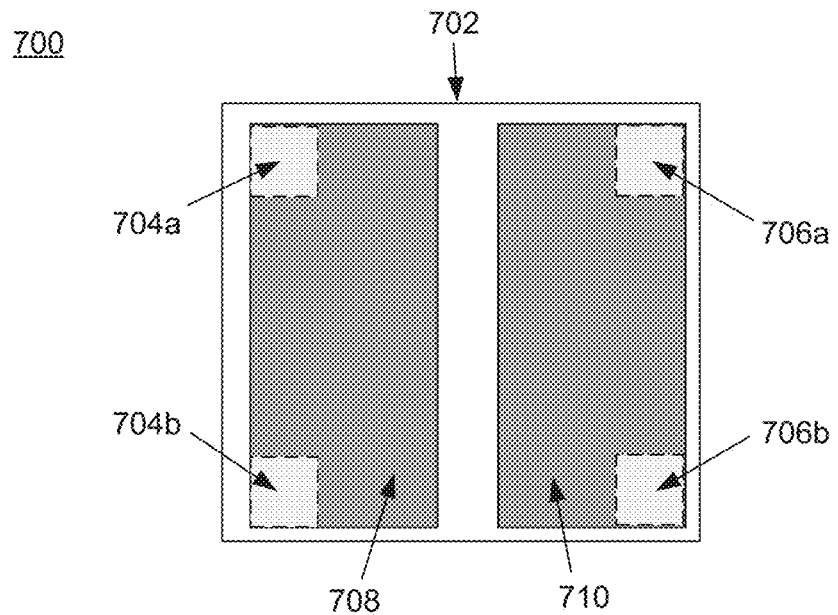
FIG. 7 depicts patterned contact pads according to embodiments.
Figure 7:
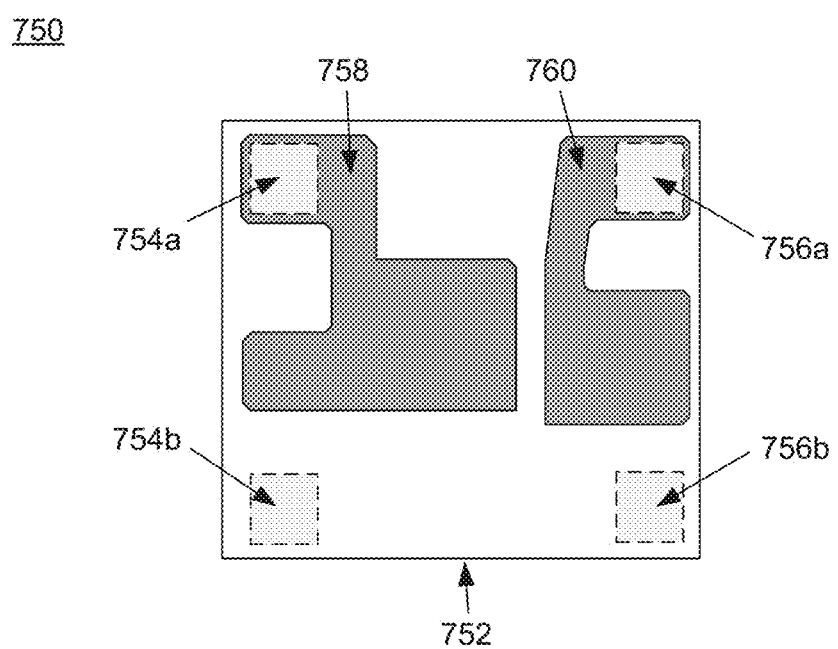

In embodiments according to the present invention, one or more relatively large conductive contact pads formed on the IC may be used instead of (or in addition to) bumps. Diagram 700 in FIG. 7 depicts a top view of IC 702 having large contact pads 708 and 710. In diagram 700 each large contact pad is electrically coupled to IC 702 via a pair of IC contacts, but one IC contact may be used instead, or three or more may be used, or zero may be used in the case of capacitive coupling between IC 702 and the contact pads. As depicted in diagram 700, contact pad 708 is electrically coupled to IC 702 via IC contact pair 704a and 704b, and contact pad 710 is electrically coupled to IC 702 via IC contact pair 706a and 706b. Large contact pads 708 and 710 are, in turn, configured to provide capacitive or galvanic coupling to external electrical elements such as the antenna terminals on an RFID strap or inlay (e.g., antenna terminals 626). Large contact pads 708 and 710 provide more area for coupling to these external electrical elements, and as a result reduce the coupling impedance. They also reduce performance variations due to IC-to-antenna alignment accuracy because the predominant parasitic coupling is IC-to-contact pad rather than IC-to-antenna, and the IC-to-contact-pad alignment is typically very well controlled. In some embodiments, a dielectric or repassivation layer (e.g., repassivation layer 630) is deposited on IC 702, and large contact pads 708/710 are formed on the repassivation layer and then electrically coupled to the IC contact pairs. The coupling between the large contact pads (e.g., pads 708/710) and the antenna may be galvanic or capacitive. When capacitive, the coupling may be adjusted via the dielectric characteristics (e.g. composition, thickness) of the material disposed between the IC and the antenna (e.g., layer 636). This material may be non-conductive material covering the pads, non-conductive material covering the antenna traces (e.g. a naturally grown or enhanced oxide layer on aluminum traces), and/or any additional dielectric material. Galvanic coupling may also be provided by pressing an antenna onto the IC such that one or more "dimples" formed on the antenna make direct contact with one or more large contact pads on the IC. In some embodiments, the dimples are instead formed on the contact pads. In other embodiments, galvanic coupling may be accomplished without dimples or bumps.

Large contact pads 708/710 may cover a significant portion of the top surface of IC 702. For example, large contact pads 708/710 may cover more than 20%, 30%, 40%, 50%, 60%, 70%, 80%, 90%, or even up to 100% of the top surface of IC 702. Regardless of the amount of coverage, large contact pads 708/710 are distinguishable from bumps by their predisposition to have at least one of a significantly larger surface area, a differing aspect ratio (height versus width or area), and a flat or textured-flat top when compared with bumps. By contrast, bumps typically have a small diameter that is similar or perhaps twice that of the underlying antenna contacts 633 and are small relative to the size of the IC. They also tend to have a similar aspect ratio to the underlying antenna contacts 633 (i.e. typically circularly shaped if the underlying bumps are circular or octagonal). Finally, bumps often have a rounded rather than a flat top. Of course, not all of these differences are required or absolute, but a large contact pad is easily distinguishable from a bump.

In some embodiments, large contact pads on a surface of the IC are confined within or extend up to that surface's perimeter. In other embodiments, large contact pads may extend out beyond the perimeter of an IC surface and may wrap around or encroach onto neighboring IC surfaces, or even extend outward from the IC surface in a cantilevered fashion.

Whereas large contact pads 708/710 in diagram 700 are shown as substantially rectangular, large contact pads do not need to be rectangular. Large contact pads may be circular, annular, or have any suitable shape. Diagram 750 depicts a top view of IC 752 with one IC contact pair having contacts 754a and 754b (similar to contacts 704a and 704b) and another IC contact pair having contacts 756a, 756b (similar to contacts 706a and 706b). Contact pads 758 and 760 overlie and electrically couple to contacts 754a and 756a, respectively. Contact pads 754b and 756b may remain unconnected, may couple to other electrical elements, may have any other purpose, or may not even exist.

Large contact pads 758 and 760 may be fabricated and shaped by patterning a deposited conductive redistribution layer as described above in reference to FIG. 6. The shapes and/or orientations of the contact areas may be based on aesthetics, ease of electrically coupling to antenna terminals, and/or reducing parasitic coupling to sensitive components in IC 752. In the latter case, the conductive redistribution layer may be patterned such that portions of the redistribution layer whose local parasitic capacitance to IC 752 (or elements in IC 752) exceed a particular threshold are excised during the patterning process. The portions may be removed after deposition or prevented from being depositing in the first place. The threshold(s) may be determined based on, for example, a desired parasitic capacitance of the entire IC or a desired local parasitic capacitance of a portion of the IC. Also as shown in diagram 750, contact areas 708 and 710 may have curved or rounded edges, for example to ease masking, etching, and/or liftoff patterning processes.

Figure 8:
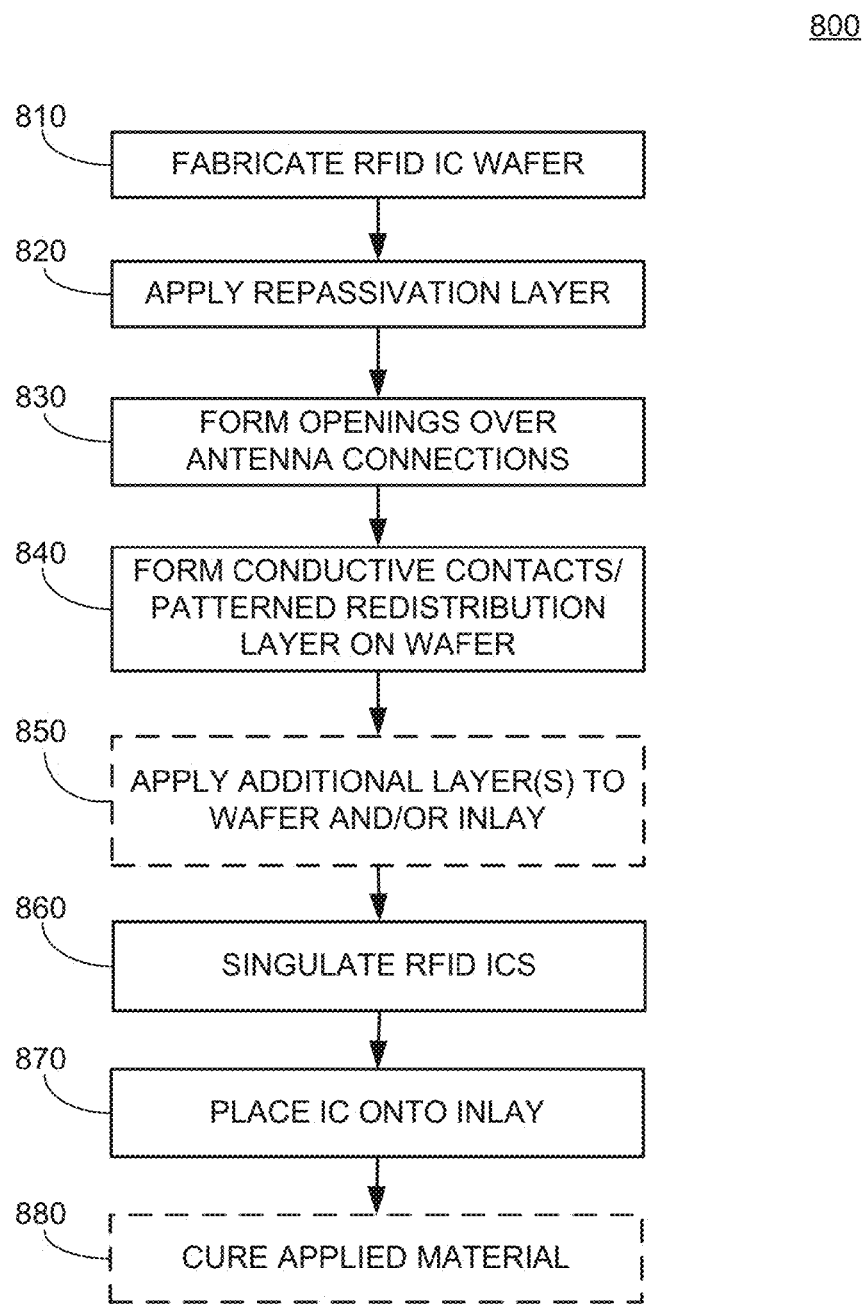
FIG. 8 is a flowchart of a process for fabricating an RFID tag with a repassivation layer according to embodiments.

FIG. 8 is a flowchart of process 800 for fabricating an RFID tag with a repassivation layer according to embodiments. Process 800 begins with step 810, where an RFID wafer is fabricated. An RFID wafer typically includes multiple tag ICs as described above. At step 820 a repassivation layer is applied to the wafer. This repassivation layer may be an organic material. Subsequently, or as part of forming the repassivation layer, at step 830 openings are formed in the repassivation layer and over the antenna contacts of the ICs, for example using techniques such as masking and etching. Next, at step 840, a conductive redistribution layer is formed over the repassivation layer, typically patterned to form large contact pads as described with reference to FIG. 7. Also in step 840, conductive contacts, bumps or portions of the conductive redistribution layer deposited in the openings electrically couple the large contact pads to antenna connections of the IC.

In some embodiments, one or more additional layers (e.g., layer/adhesive 636) may be applied to the wafer at optional step 850. These additional layers may include an anisotropic conductive layer, an isotropic conductive layer, and/or a nonconductive layer, and may be organic, inorganic (e.g., metal), or a combination thereof. In some embodiments the additional layers may be patterned. The additional layers may also include adhesives for affixing the ICs to inlays. In some embodiments, the additional layers may be applied to inlays instead of the wafer.

At step 860, the RFID ICs are singulated (i.e. separated from each other) by one or more of mechanical sawing, laser dicing, etching, annealing and breaking, or any other suitable singulation method, as described below in FIG. 10. Subsequently, at step 870, the ICs are placed onto inlays, which include a substrate and a patterned antenna as described above. As mentioned previously, adhesives may be applied to the inlays or the surface of the repassivation layer before attaching the RFID ICs to the inlays. In some embodiments, any applied material (e.g., layers or adhesives applied in step 850) that was not previously fully cured (e.g., as part of step 850) may be cured at optional step 880 using, for example, a thermal and/or mechanical process.

As described above, adhesives may be used to attach ICs to inlays. In some situations, uncured liquid adhesive may first be placed on an inlay or an IC, and then the two brought together and the adhesive cured. Using uncured liquid adhesives for attaching ICs to inlays can present several challenges. First, the temperature and humidity of the inlay assembly line may affect the size and viscosity of a deposited adhesive drop, thus making it difficult to control adhesive placement and characteristics. Second, as uncured liquid adhesive ages, its viscosity changes, leading to waste during the drop deposition process and reduction in IC alignment accuracy. Third, an IC placed on uncured liquid adhesive may float, resulting in undesired movement and subsequent variations in placement, alignment, and performance. Finally, if a batch of uncured liquid adhesive is not used quickly enough, any remainder must be discarded, leading to further waste.

B-stage adhesives offer an alternative to uncured liquid adhesives for attaching ICs to inlays. A B-stage adhesive is an adhesive material that can be partially cured (e.g., via the application of heat or radiation) into a stable intermediate state after initial deposition but before final assembly. According to embodiments herein, a B-stage adhesive can be applied to an IC or inlay in a controlled environment (i.e., not on the inlay assembly line) and then first partially cured into the stable intermediate state. In the intermediate stable state, the B-stage adhesive is relatively easy to handle, and lack many of the disadvantages of uncured liquid adhesives described above. Tag assembly is then performed with the B-stage adhesive in the stable intermediate state. Finally, the B-stage adhesive is completely cured after tag assembly is complete.

Figure 9:
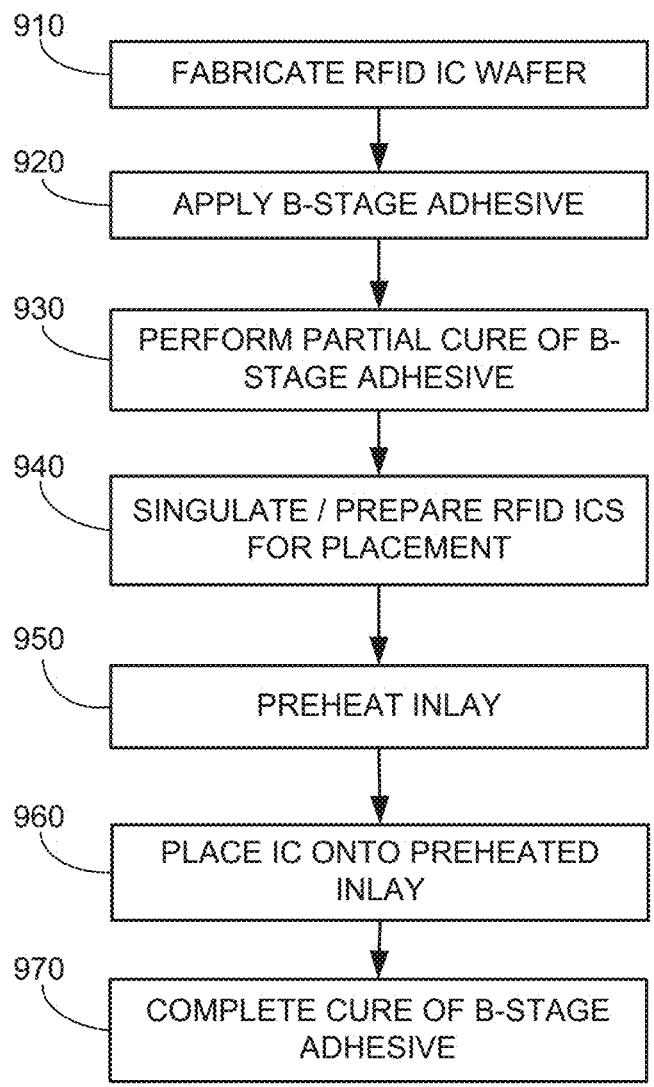
FIG. 9 is a flowchart of a process for attaching an RFID IC to an inlay using B-stage adhesives according to embodiments.

FIG. 9 is a flowchart of a process 900 for attaching an RFID IC to an inlay using B-stage adhesives according to embodiments. In step 910, an RFID IC wafer is fabricated, as described in FIG. 8. In some embodiments, repassivation and other conductive or nonconductive layers may be applied to the wafer and patterned as described herein. After IC wafer fabrication, a B-stage adhesive may be applied to the wafer in step 920. The B-stage adhesive may be applied by spin-coating, screen-printing, inkjet printing, or any other suitable application method. In some embodiments, the B-stage adhesive may be applied in a relatively continuous layer over the entire wafer (e.g., as would be the case with spin-coating). In other embodiments, the B-stage adhesive may be selectively applied to particular portion(s) of each IC on the wafer, for example using screen-printing, inkjet printing, or any other suitable method for selective adhesive deposition. The B-stage adhesive may be electrically conductive or nonconductive.

In step 930 the applied B-stage adhesive is partially cured into a stable intermediate state. The partial-curing process may involve exposure to ultraviolet radiation and/or heat. The resulting partially cured B-stage adhesive is typically stable, relatively solid, and not tacky, allowing ease of handling. Subsequently, in step 940 the RFID ICs on the wafer are singulated and prepared for placement onto inlays, such as, for example, by mounting on wafer tape and dicing. In step 950, an inlay on which an IC is to be placed is preheated (e.g., via a laser, infrared radiation, a thermode, or any other suitable heating means). In step 960, an IC with partially-cured B-stage adhesive in the stable intermediate state is placed onto the preheated inlay, and the heat causes the partially-cured B-stage adhesive to soften and adhere to the inlay. Finally, in step 970 the B-stage adhesive may be completely cured by applying heat, pressure, and/or ultraviolet radiation.

Whereas in process 900 the B-stage adhesive is applied to the ICs and partially cured into the stable intermediate state before singulation, in other embodiments the B-stage adhesive may be applied and partially cured after singulation (i.e., step 940 may occur before step 920). In some embodiments, the B-stage adhesive may be applied to the inlay instead of (or in addition to) the ICs. Similarly, while the inlay is preheated in process 900, in other embodiments the IC may instead (or also) be preheated.

As described above, RFID ICs on a wafer are singulated before placement on inlays. FIG. 10 illustrates a process 1000 for preparing ICs on a wafer for singulation, according to embodiments. In step 1002, ICs 1006 are fabricated as part of wafer 1004, similar to steps 810 and 910 in FIGS. 8 and 9. Subsequently, in step 1008 a patterned photoresist layer 1010 is formed on the front side of wafer 1004, over the ICs. In embodiments as described herein, the photoresist has exposed channels 1012 surrounding the peripheries of the ICs. Photoresist layer 1010 may be patterned by coating wafer 1004 with the photoresist layer, exposing the photoresist layer to light through a photomask with a predefined pattern, and then developing the photoresist to remove portions of the photoresist corresponding to channels 1012 on the photomask. Channels 1012 expose "scribe streets" on wafer 1004, which are thin spaces between individual ICs that may be safely cut or removed to singulate but not damage the ICs. In some embodiments, the scribe streets may contain or overlap sacrificial circuit elements, interconnects, or wires that are not part of the ICs, but may be used for testing, characterization, and modification of the ICs while they are on the wafer.

Subsequently, in step 1014 wafer 1004 is cut along the scribe streets exposed by channels 1012 for singulating individual ICs 1006. Cuts 1016 may be formed using a number of different techniques, such as by using a saw or a laser to cut along the exposed scribe streets. In some embodiments cuts 1016 may be formed by etching, where exposed wafer material in the scribe streets is removed by reaction with etchant chemicals in a liquid or aqueous phase (wet etching), or with a chemically reactive gas or plasma (dry etching). Etching techniques may be isotropic, in which the etch rates are similar in all directions, or anisotropic, in which the etch proceeds faster in some directions (e.g., vertically or along a particular crystal plane). For a given etch rate, isotropic etching requires larger scribe street and channel widths than anisotropic etching, to prevent IC damage due to the horizontal etching associated with isotropic processes. Therefore, anisotropic etching is generally preferred for singulating ICs from a wafer. In some embodiments, cuts 1016 may use a multi-step etching process for fine etch control, such as by alternately forming a dielectric passivation layer on the sides of the cuts, partially etching the wafer in channels 1012, and then forming a dielectric passivation layer on the newly etched sides of the cuts. The shallow-etching process may be repeated a number of times to cut through the wafer. Cuts 1016 may use wet etching, dry etching, or a combination of wet and dry etching.

Figure 11:
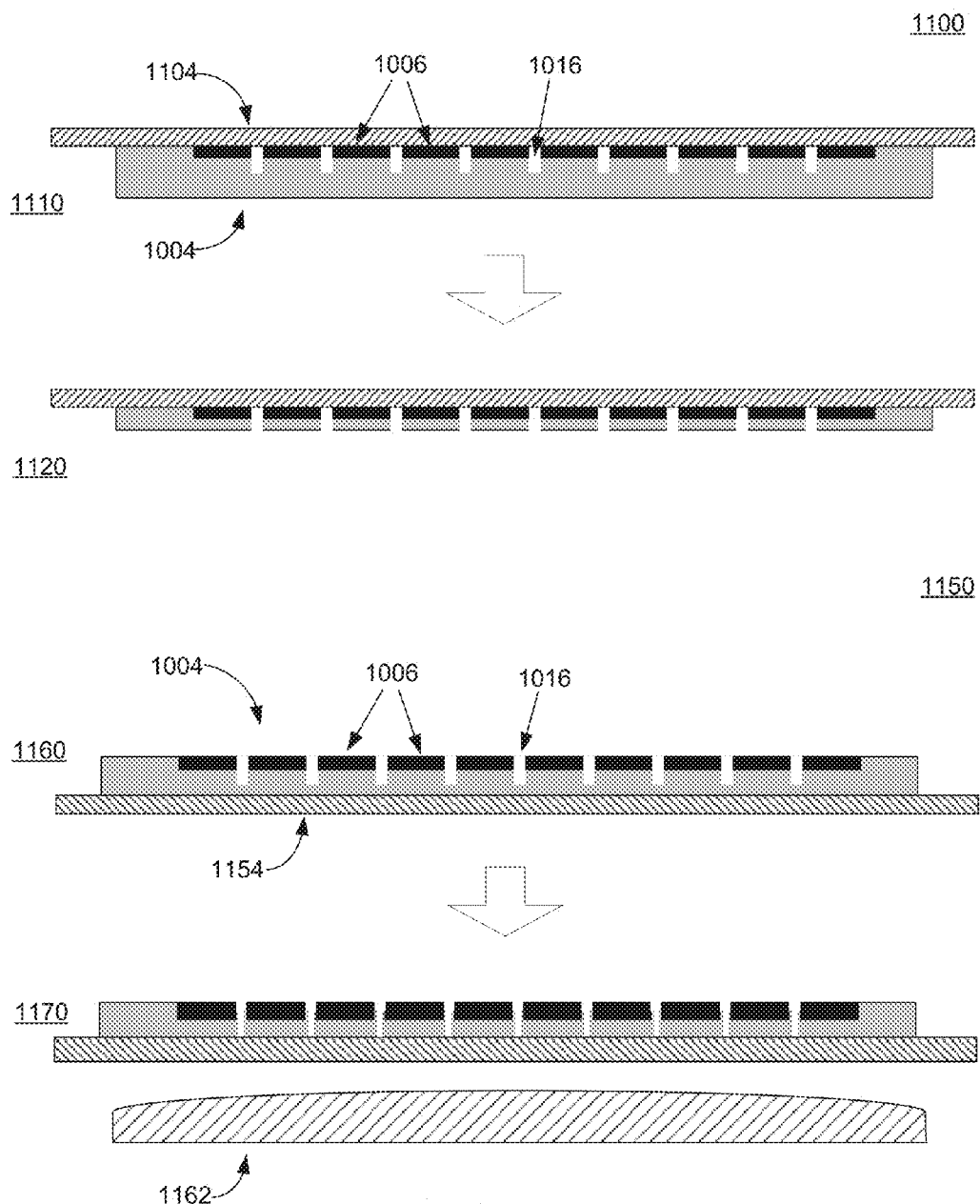
FIG. 11 illustrates processes for further singulating ICs from a wafer after the process of FIG. 10, according to embodiments.

In some embodiments, cuts 1016 only penetrate part way through the wafer, rather than all the way through the wafer, leaving the ICs only partially singulated. The ICs may then be fully singulated in a separate processing step. FIG. 11 illustrates processes 1100 and 1150 for fully singulating ICs from a partially etched wafer, according to embodiments. In step 1110 of process 1100, the front side of partially etched wafer 1004 is mounted on a protective tape 1104. In step 1120, wafer 1004 is thinned by a grinding process such as chemical-mechanical polishing/planarization (CMP) to remove material from the wafer backside until the ICs are singulated (i.e., until the wafer has been thinned to the bottoms of the cuts 1016).

Alternative process 1150 uses cuts 1016 to facilitate mechanically breaking the wafer along the scribe streets. Cuts 1016 create weaknesses in wafer 1004 such that, when a backside force is applied to wafer 1004, it breaks along cuts 1016, thus singulating ICs 1006. In step 1160, the backside of wafer 1004 (which may be background to reduce its thickness) is mounted on a protective tape 1154. Subsequently, in step 1170, the taped wafer backside is then drawn over a non-planar or rounded object or surface 1162 (e.g., a breaking object such as a mandrel or anvil, or an arch or ball), causing the wafer to break along the lines of cuts 1016. In an alternative approach, IC singulation may be performed by pulling or stretching tape 1154. The stress of pulling and stretching can cause the individual ICs to separate and pull apart along cuts 1016. Typically, the breaking causes little or no damage to the ICs.

In alternative embodiments the front side of wafer 1014 may be drawn over non-planar surface 1162. In yet other embodiments complete or partial cuts may be initiated from the back side of wafer 1004 rather than from the front side, and in the case of partial cuts the final separation may use any of the methods described above.

Figure 12:
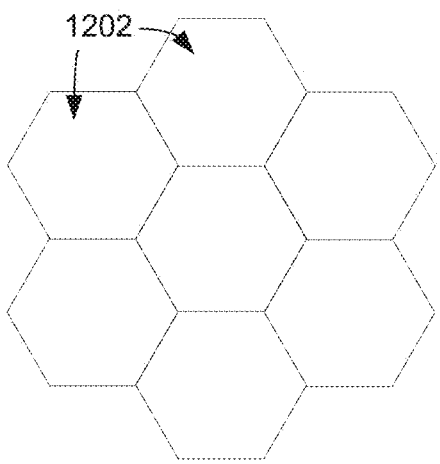
FIG. 12 depicts non-square RFID ICs that may be formed using the singulation process of FIG. 10, according to embodiments.
Figure 12:
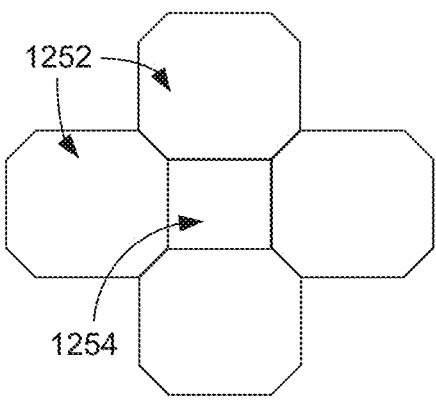

One advantage of using etching to singulate ICs is that non-rectangular ICs may be formed. Non-rectangular ICs have fewer or no sharp corners and less internal stress than square or rectangular ICs, resulting in improved IC strength. The absence of sharp corners may also reduce damage during handling or IC-inlay assembly. FIG. 12 depicts non-rectangular RFID ICs that may be formed using the singulation process of FIG. 10, according to embodiments. Diagram 1200 shows hexagonal ICs 1202, which pack closely on a wafer. Diagram 1250 shows octagonal ICs 1252. Octagons cannot pack as closely as hexagons, and so at least some wafer area may be lost. In some embodiments, the lost wafer area may be used for other ICs, such as rectangular IC 1254, thereby reducing the amount of wasted wafer area.

As described above in relation to FIG. 10, an etching process may employ a photoresist to align the wafer cuts or trenches that singulate ICs from the wafer. Unfortunately, in many instances, the stripping process that subsequently removes photoresist may damage structures formed on the surface of the IC, such as a repassivation layer. In some instances the stripping process may actually strip the repassivation layer from the IC as it strips the photoresist, obviating the benefits of depositing the repassivation layer in the first place. Depositing the repassivation layer after wafer etching may seem to address this issue, but in the case of partial wafer etching as described in FIG. 11 the repassivation layer may fill cuts (e.g., cuts 1016) and degrade the breaking process; in the case of complete wafer etching the repassivation layer may wrap around the sides of the ICs and cause irregular, poorly-shaped die.

Figure 13:
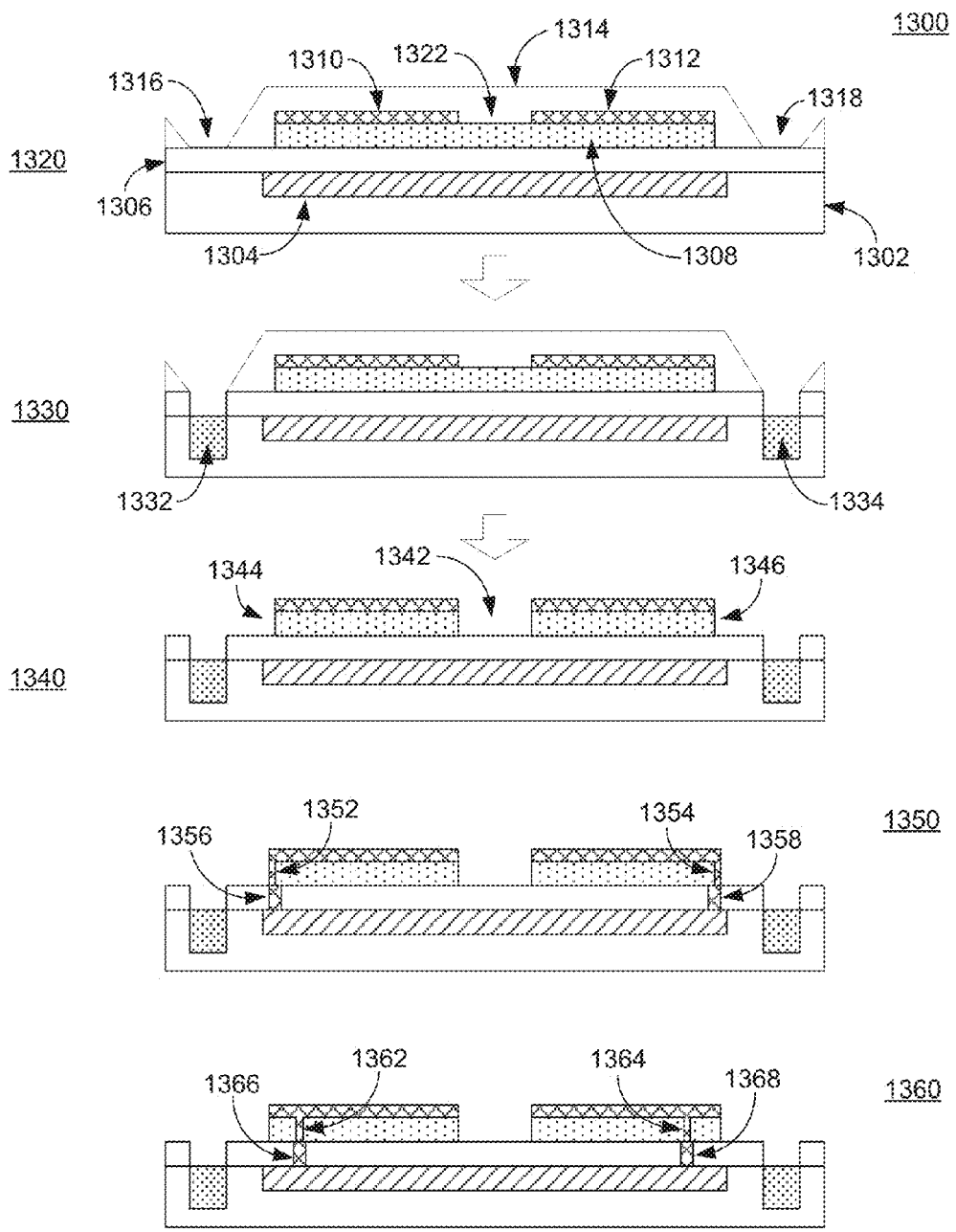
FIG. 13 illustrates how an etching process may also be used to form contact islands on an IC, according to embodiments.

Diagram 1300 in FIG. 13 illustrates how the etching process that singulates ICs also can also form protected contact islands, according to embodiments. Diagram 1300 depicts a cutaway portion of wafer 1302 showing circuitry 1304 of an individual IC. Circuitry 1304 is shown covered by an optional dielectric layer 1306, such as a glass or inter-layer dielectric (ILD). A repassivation layer 1308 (similar to repassivation layer 630) is disposed on the IC covering at least a portion of circuitry 1304. Contact pads 1310 and 1312 (similar to contact pads 708/710 and conductive redistribution layer 634) are deposited on repassivation layer 1308. Repassivation layer 1308 is partially exposed in the uncovered portion 1322 between contact pads 1310 and 1312. Referring to FIG. 7, uncovered portion 1322 may correspond to the IC surface between contact pads 708 and 710 in diagram 700 or contact pads 758 and 760 in diagram 750. In some embodiments, contact pads 1310/1312 may be deposited so as to cover at least a part of the side surfaces of repassivation layer 1308 (e.g., as described below in diagram 1350). In other embodiments, contact pads 1310/1312 may leave the side surfaces of repassivation layer 1308 entirely exposed.

Figure 10:
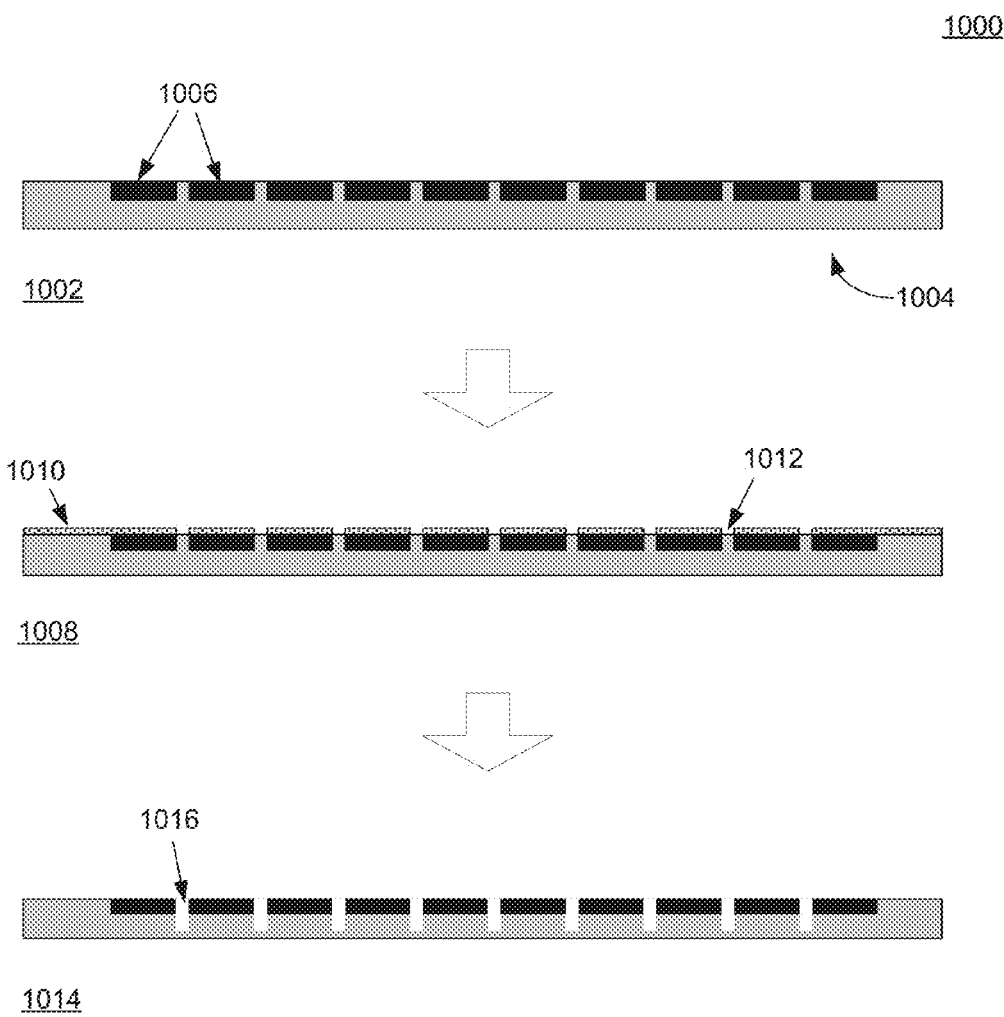
FIG. 10 illustrates a process for preparing ICs on a wafer for singulation, according to embodiments.

In preparation for the etching process described in FIG. 10, in step 1320 a masking layer 1314 (e.g. a photoresist) is applied to wafer 1302 and patterned to expose channels 1316 and 1318 for etching, similar to channels 1012 in FIG. 10. Subsequently, in step 1330 cuts 1332 and 1334 are etched through optional dielectric layer 1306 and into wafer 1302 at channels 1316 and 1318, for example using dry etching, wet etching, or a combination, as described in reference to FIG. 10.

In step 1340, masking layer 1314 is stripped from wafer 1302. Masking layer 1314 may be stripped using a dry process (e.g., plasma cleaning) or a wet process (e.g., solvent stripping). If masking layer 1314 includes organic material then the stripping process may be optimized to remove this organic material. If masking layer 1314 and repassivation layer 1308 both include organic components then the stripping process is likely to remove exposed portions (e.g. uncovered portion 1322) of repassivation layer 1308 along with masking layer 1314. While inadvertent and detrimental in some situations, in other situations this stripping process may allow patterning structures on the IC by removing exposed portions of repassivation layer 1308 in one step.

Contact pads 1310/1312 may cover some regions of repassivation layer 1308, and expose other regions such as uncovered portion 1322. In step 1340, when masking layer 1314 is stripped, exposed repassivation layer portion 1322 may also be removed to form a trench or cavity 1342. By contrast, those portions of repassivation layer 1308 that underlie contact pads 1310/1312 will remain protected and undamaged from the stripping agent by the (typically metallic) contact pads (with the potential exception of some undercut near the pad edges). As a result, raised or elevated contact islands 1344 and 1346 may be formed, each with a top layer corresponding to contact pad 1310 or 1312 and a bottom layer corresponding to repassivation material underlying contact pads 1310/1312. Of course, repassivation material 1314 need not be fully removed from trench 1342; step 1340 shows full removal solely for reasons of clarity.

In some embodiments, other layers may be interposed between the top layer and the bottom layer of a contact island, or between the contact island and optional dielectric layer 1306 of the IC. These other layers may include additional dielectric layers or conductive layers, and may be used to adjust the physical and/or electrical (e.g., conductive, capacitive, inductive, etc.) characteristics of the contact island.

In some embodiments, raised contact islands 1344 and 1346 may include side contact portions 1352 and 1354, respectively, as shown in diagram 1350. Side contact portions 1352/1354 may provide electrical coupling between contact pads 1310/1312 and circuitry 1304. In some embodiments they may form this coupling through vias 1356 and 1358 through optional dielectric layer 1306. Side contact portions 1352/1354 may also (or instead) protect the sides of the repassivation layer portions underlying the contact pads 1310/1312 from the stripping process described above. Side contact portions 1352/1354 may be deposited as part of contact pads 1310/1312 or may be deposited separately.

In some embodiments, contact pads 1310/1312 may electrically couple to circuitry 1304 through repassivation layer vias 1362 and 1364 and optional dielectric layer vias 1366 and 1368, as shown in diagram 1360. In these embodiments, the side surfaces of raised contact islands 1344/1346 may be fully protected (e.g., by side contact portions 1352/1354), partially protected, or entirely exposed.

Whereas masking layer 1314 is described as being used to form channels for etching, in other embodiments masking layer 1314 (or another masking layer) may be used for implantation processes. Implantation processes are used in IC fabrication to modify the physical or electronic behavior of certain portions of a wafer. For example, ions may be implanted into portions of wafer 1302 and/or overlying layers to form doped regions with higher electrical conductivity. Mask layers, such as masking layer 1314, may be used to guide implantation processes by selectively exposing portions of wafer 1302 to be doped or implanted.

Figure 14:
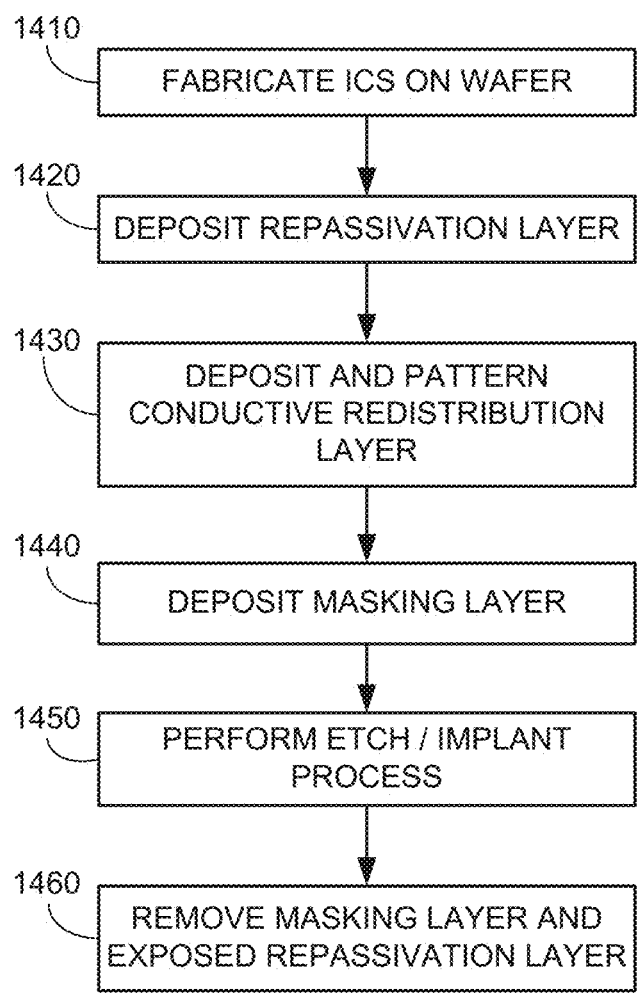
FIG. 14 is a flowchart of a process for forming contact islands on an IC, according to embodiments.

FIG. 14 is a flowchart of a process 1400 for forming contact islands on an IC, according to embodiments. In step 1410, ICs are fabricated on a wafer, as described above in FIGS. 8 and 9. In step 1420, a repassivation layer (e.g., repassivation layer 1308) is deposited on the wafer. In step 1430, a conductive redistribution layer (e.g., conductive redistribution layer 634) is deposited on the repassivation layer and patterned as described above in FIG. 7. The conductive redistribution layer may be patterned to form contact pads (e.g., contact pads 1310/1312) that also function to protect underlying portions of the repassivation layer. In step 1440 a masking layer (e.g., masking layer 1314) is deposited on the wafer and patterned to expose portions of the wafer. The masking layer may expose channels for singulation (e.g., channels 1316/1318), or may expose portions of the wafer for implantation. In step 1450, an etching or implantation process is performed at the exposed wafer portions. Finally, in step 1460 a stripping process is used to remove the masking layer and portions of the repassivation layer not protected by the conductive redistribution layer, thus forming raised contact islands (e.g., raised contact islands 1344/1346).

Figure 15:
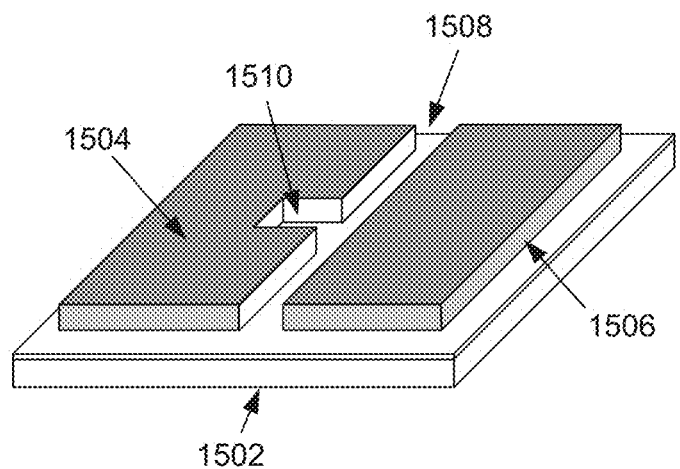
FIG. 15 depicts patterned contact islands according to embodiments.
Figure 15:
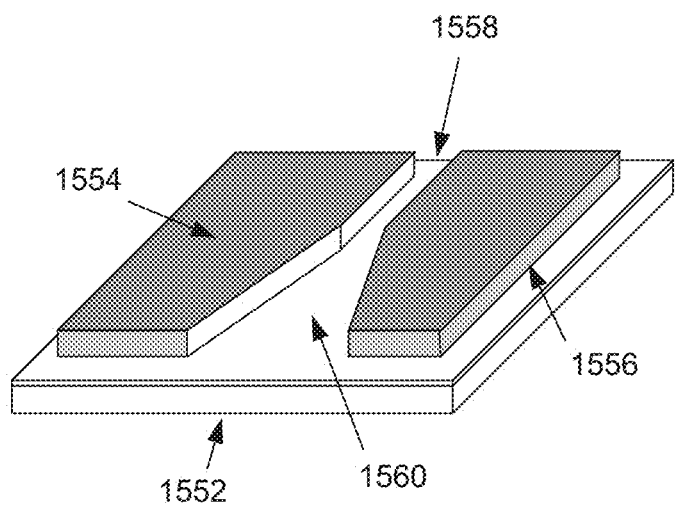

In some embodiments, raised contact islands on an IC may be shaped and/or used for inlay alignment during tag assembly. FIG. 15 depicts patterned contact islands according to embodiments. Diagram 1500 depicts a perspective view of IC 1502 having raised contact islands 1504 and 1506, similar to raised contact islands 1344 and 1346. Trench 1508, similar to trench 1342, separates raised contact islands 1504 and 1506. In some embodiments, trench 1508 may be used to align IC 1502 during assembly onto an inlay. For example, the inlay may include a raised portion sized to fit within trench 1508 and located at a desired IC location on the inlay. When IC 1502 is placed onto the inlay, the raised inlay portion fits into trench 1508, thus preferentially guiding IC 1502 into the desired IC location. Since trench 1508 has directionality, the raised inlay portion may be oriented such that IC 1502 is assembled onto the raised inlay portion with a particular orientation. To further refine the IC assembly orientation, additional alignment features can be used. For example, IC 1502 may include notch 1510 in raised contact island 1504, and the inlay may include a raised portion sized to fit notch 1510. During inlay assembly, notch 1510 and its corresponding raised inlay portion, along with trench 1508 and its corresponding raised inlay portion, causes IC 1502 to preferentially assume a single orientation. In some embodiments, IC assembly and alignment onto an inlay may be further facilitated by external processes such as vibration, gravity, electrostatic or magnetic attraction/repulsion, liquid-based self-assembly, or any other suitable process.

Diagram 1550 depicts a perspective view of another IC 1552 having raised contact islands for alignment during assembly. Raised contact islands 1554 and 1556 are separated by trench 1558 (similar to trench 1508) as well as an alignment region 1560. An inlay on which IC 1552 is to be assembled may include raised portions shaped to fit trench 1558 and alignment region 1560 at a desired IC location on the inlay and having a desired IC orientation. Subsequently, when IC 1552 is assembled on the inlay, the raised portions on the inlay and trench 1558/alignment region 1560 cause IC 1552 to preferentially assemble in the desired location and with the desired orientation.

As described above, a contact island may include a top layer corresponding to a contact pad and a bottom layer corresponding to a repassivation layer. In some embodiments, at least part of the side surfaces of the repassivation layer in a contact island may be covered or protected by another layer, such as side contact portions 1352/1354 described above. For example, the side surfaces around the periphery of the contact islands in diagrams 1500 and 1550 may be protected by another layer (as indicated by the light gray shading), while the interior surfaces facing trenches 1508/1558, the notch 1510, and/or alignment region 1560 may not be protected (as indicated by the lack of shading).

While the sides of contact islands 1344/1346, 1504/1506, and 1554/1556 are depicted as substantially vertical with respect to the IC surface, in some embodiments at least a portion of the contact-island sides may be slanted, tilted, or sloped with respect to the IC surface. For example, in diagram 1350 the sides of contact islands 1344/1346 covered by side contact portions 1352/1354 may be sloped. The slope may be steep (i.e., approaching a near-vertical orientation with respect to the IC surface), shallow (i.e., approaching a near-horizontal orientation with respect to the IC surface), or somewhere in between. In some embodiments, the slope of contact island sides facing portions etched in the repassivation layer (e.g., trenches 1342/1508/1558, notch 1510, and/or alignment region 1560) may be shaped by the mask removal/etching process described above.

The steps described in processes 800, 900, and 1400 are for illustration purposes only. An RFID IC may be patterned, singulated, and assembled onto an inlay using additional or fewer steps and in different orders using the principles described herein. Of course the order of steps may be modified, some steps eliminated, or other steps added according to other embodiments. For example, while processes 800 and 900 are described in the context of placing an RFID IC onto an inlay, the same processes may also be used for placing an RFID IC onto a printer-circuit board or a strap (e.g., strap 254 in FIG. 2) with minimal modification. In embodiments where the RFID IC is placed onto a strap, additional steps may be required to fabricate an RFID tag from the IC-strap combination.

The foregoing detailed description has set forth various embodiments of the devices and/or processes via the use of block diagrams and/or examples. Insofar as such block diagrams and/or examples contain one or more functions and/or aspects, it will be understood by those within the art that each function and/or aspect within such block diagrams or examples may be implemented, according to embodiments formed, individually and/or collectively, by a wide range of hardware, software, firmware, or virtually any combination thereof.

Embodiments as described herein additionally include programs, and methods of operation of the programs. A program is generally defined as a group of steps or operations leading to a desired result, due to the nature of the elements in the steps and their sequence. A program is usually advantageously implemented as a sequence of steps or operations for a processor, such as the structures described above.

Performing the steps, instructions, or operations of a program requires manipulation of physical quantities. Usually, though not necessarily, these quantities may be transferred, combined, compared, and otherwise manipulated or processed according to the steps or instructions, and they may also be stored in a computer-readable medium. These quantities include, for example, electrical, magnetic, and electromagnetic charges or particles, states of matter, and in the more general case can include the states of any physical devices or elements. It is convenient at times, principally for reasons of common usage, to refer to information represented by the states of these quantities as bits, data bits, samples, values, symbols, characters, terms, numbers, or the like. It should be borne in mind, however, that all of these and similar terms are associated with the appropriate physical quantities, and that these terms are merely convenient labels applied to these physical quantities, individually or in groups.

Executing a program's steps or instructions may further require storage media that have stored thereon a program's instructions and/or data, typically in a machine-readable form. This storage media is typically termed a memory, read by a processor or other machine element. In electronic devices the memory may be implemented as Read Only Memory (ROM), Random Access Memory (RAM), and many others as will be well known to those skilled in the art. In some embodiments the memory may be volatile and in others nonvolatile.

Even though it is said that the program may be stored in a computer-readable medium, it should be clear to a person skilled in the art that it need not be a single memory, or even a single machine. Various portions, modules or features of it may reside in separate memories, or even separate machines. The separate machines may be connected directly, or through a network such as a local access network (LAN) or a global network such as the Internet.

Often, for the sake of convenience only, it is desirable to implement and describe a program as software. The software can be unitary, or thought in terms of various interconnected distinct software modules.

This detailed description is presented largely in terms of flowcharts, algorithms, and symbolic representations of operations on data bits on and/or within at least one medium that allows computational operations, such as a computer with memory. Indeed, such descriptions and representations are the type of convenient labels used by those skilled in programming and/or the data-processing arts to effectively convey the substance of their work to others skilled in the art. A person skilled in the art of programming may use these descriptions to readily generate specific instructions for implementing a program according to the present invention.

The present disclosure is not to be limited in terms of the particular embodiments described in this application, which are intended as illustrations of various aspects. Many modifications and variations can be made without departing from its spirit and scope, as will be apparent to those skilled in the art. Functionally equivalent methods and apparatuses within the scope of the disclosure, in addition to those enumerated herein, will be apparent to those skilled in the art from the foregoing descriptions. Such modifications and variations are intended to fall within the scope of the appended claims. The present disclosure is to be limited only by the terms of the appended claims, along with the full scope of equivalents to which such claims are entitled. It is to be understood that this disclosure is not limited to particular methods, configurations, antennas, transmission lines, and the like, which can, of course, vary. It is also to be understood that the terminology used herein is for the purpose of describing particular embodiments only, and is not intended to be limiting.

With respect to the use of substantially any plural and/or singular terms herein, those having skill in the art can translate from the plural to the singular and/or from the singular to the plural as is appropriate to the context and/or application. The various singular/plural permutations may be expressly set forth herein for sake of clarity.

It will be understood by those within the art that, in general, terms used herein, and especially in the appended claims (e.g., bodies of the appended claims) are generally intended as "open" terms (e.g., the term "including" should be interpreted as "including but not limited to," the term "having" should be interpreted as "having at least," the term "includes" should be interpreted as "includes but is not limited to," etc.). It will be further understood that if a specific number of an introduced claim recitation is intended, such an intent will be explicitly recited in the claim, and in the absence of such recitation no such intent is present. For example, as an aid to understanding, the following appended claims may contain usage of the introductory phrases "at least one" and "one or more" to introduce claim recitations. However, the use of such phrases should not be construed to imply that the introduction of a claim recitation by the indefinite articles "a" or "an" limits any particular claim containing such introduced claim recitation to embodiments containing only one such recitation, even when the same claim includes the introductory phrases "one or more" or "at least one" and indefinite articles such as "a" or "an" (e.g., "a" and/or "an" should be interpreted to mean "at least one" or "one or more"); the same holds true for the use of definite articles used to introduce claim recitations. In addition, even if a specific number of an introduced claim recitation is explicitly recited, those skilled in the art will recognize that such recitation should be interpreted to mean at least the recited number (e.g., the bare recitation of "two recitations," without other modifiers, means at least two recitations, or two or more recitations).

Furthermore, in those instances where a convention analogous to "at least one of A, B, and C, etc." is used, in general such a construction is intended in the sense one having skill in the art would understand the convention (e.g., "a system having at least one of A, B, and C" would include but not be limited to systems that have A alone, B alone, C alone, A and B together, A and C together, B and C together, and/or A, B, and C together, etc.). It will be further understood that virtually any disjunctive word and/or phrase presenting two or more alternative terms, whether in the description, claims, or drawings, should be understood to contemplate the possibilities of including one of the terms, either of the terms, or both terms. For example, the phrase "A or B" will be understood to include the possibilities of "A" or "B" or "A and B."

As will be understood by one skilled in the art, for any and all purposes, such as in terms of providing a written description, all ranges disclosed herein also encompass any and all possible subranges and combinations of subranges thereof. Any listed range can be easily recognized as sufficiently describing and enabling the same range being broken down into at least equal halves, thirds, quarters, fifths, tenths, etc. As a non-limiting example, each range discussed herein can be readily broken down into a lower third, middle third and upper third, etc. As will also be understood by one skilled in the art all language such as "up to," "at least," "greater than," "less than," and the like include the number recited and refer to ranges which can be subsequently broken down into subranges as discussed above. Finally, as will be understood by one skilled in the art, a range includes each individual member.

We claim:

1. A Radio Frequency Identification (RFID) integrated circuit (IC) comprising:
   a plurality of contact islands raised from a surface of the IC, the contact islands confined within a perimeter of the IC and separated from each other by at least one trench, the at least one trench spanning at least a width of an adjacent contact island, and the contact islands covering substantially an entire surface area of the IC except for the at least one trench, wherein each contact island includes:
      a nonconductive repassivation layer disposed on the surface of the IC;
      a conductive contact layer disposed on and covering the repassivation layer; and
      an electrical coupling between the contact layer and a circuit block in the IC.

2. The IC of claim 1, wherein the circuit block includes at least one of a rectifier, a modulator, and a demodulator.

3. The IC of claim 1, wherein the contact layer is metallic and is configured to protect the covered repassivation layer during etching.

4. The IC of claim 1, wherein the electrical coupling of at least one of the contact islands is through at least one of:
   the repassivation layer of the respective contact island; and
   a side contact disposed on a side of the respective contact island.

5. The IC of claim 1, wherein the contact layer is configured to couple to an antenna terminal on an inlay.

6. The IC of claim 1, wherein the at least one trench forms an alignment structure for aligning a placement of the IC on an inlay.

7. The IC of claim 1, further comprising a B-stage adhesive disposed on the conductive contact layer.

8. A Radio Frequency Identification (RFID) integrated circuit (IC) comprising:
- a plurality of contact islands raised from a surface of the IC and separated from each other by at least one trench, the at least one trench spanning at least a width of an adjacent contact island, and the contact islands covering substantially an entire surface area of the IC except for the at least one trench, wherein each contact island includes:
  - a nonconductive repassivation layer disposed on the surface of the IC and confined within a perimeter of the IC;
  - a conductive contact layer disposed on and covering the repassivation layer; and
  - an electrical coupling between the contact layer and at least one of a rectifier, a modulator, and a demodulator in the IC.

9. The IC of claim 8, wherein the contact layer is confined within a perimeter of the repassivation layer.

10. The IC of claim 8, wherein the electrical coupling of at least one of the contact islands is through at least one of:
- the repassivation layer of the respective contact island; and
- a side contact disposed on a side of the respective contact island.

11. The IC of claim 8, wherein the contact layer is configured to couple to an antenna terminal on an inlay.

12. The IC of claim 8, wherein the at least one trench forms an alignment structure for aligning the placement of the IC on an inlay.

13. A Radio Frequency Identification (RFID) integrated circuit (IC) comprising:
- a plurality of contact islands raised from a surface of the IC and separated from each other by at least one trench, the at least one trench spanning at least a width of an adjacent contact island, and the contact islands covering substantially an entire surface area of the IC except for the at least one trench, wherein each contact island includes:
  - a nonconductive repassivation layer disposed on the surface of the IC;
  - a conductive contact layer disposed on and covering the repassivation layer and confined within a perimeter of the IC; and
  - an electrical coupling between the contact layer and at least one of a rectifier, a modulator, and a demodulator in the IC.

14. The IC of claim 13, wherein the contact layer is metallic and is configured to protect the covered repassivation layer during etching.

15. The IC of claim 13, wherein the electrical coupling of at least one of the contact islands is through at least one of:
- the repassivation layer of the respective contact island; and
- a side contact disposed on a side of the respective contact island.

16. The IC of claim 13, wherein the contact layer is configured to couple to an antenna terminal on an inlay.

17. The IC of claim 13, wherein the at least one trench forms an alignment structure for aligning the placement of the IC on an inlay.

* * * * *

Disclaimer

9,495,631 B1 - Ronald L. Koepp, Seattle, WA (US); Harley K. Heinrich, Snohomish, WA (US); Christopher J. Diorio, Shoreline, WA (US); Tan Mau Wu, Seattle, WA (US). FRID INTEGRATED CIRCUITS WITH CONTACT ISLANDS. Patent dated November 15, 2016. Disclaimer filed May 26, 2022, by the assignee, Impinj, Inc.

I hereby disclaim the following complete claim 7 of said patent.

*(Official Gazette, March 14, 2023)*